United States Patent
Inoue et al.

(10) Patent No.: US 7,223,644 B2
(45) Date of Patent: May 29, 2007

(54) METHOD AND APPARATUS FOR PRODUCING POLYCRYSTALLINE SILICON FILM AND METHOD OF MANUFACTURING SEMICONDUCTOR DEVICE AND THIN-FILM TRANSISTOR

(75) Inventors: Mitsuo Inoue, Hyogo (JP); Hidetada Tokioka, Hyogo (JP); Shinsuke Yura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/530,026

(22) PCT Filed: Aug. 17, 2004

(86) PCT No.: PCT/JP2004/011763

§ 371 (c)(1),
(2), (4) Date: Apr. 4, 2005

(87) PCT Pub. No.: WO2005/020301

PCT Pub. Date: Mar. 3, 2005

(65) Prior Publication Data

US 2006/0051943 A1    Mar. 9, 2006

(30) Foreign Application Priority Data

Aug. 22, 2003   (JP)   ............... 2003-298671

(51) Int. Cl.
*H01L 21/00*   (2006.01)
(52) U.S. Cl. .................................... 438/166
(58) Field of Classification Search ............... 438/487, 438/149, 166
See application file for complete search history.

(56) References Cited

U.S. PATENT DOCUMENTS

| | | | |
|---|---|---|---|
| 6,372,039 B1 | 4/2002 | Okumura et al. | |
| 6,566,683 B1 | 5/2003 | Ogawa et al. | |
| 6,770,546 B2 * | 8/2004 | Yamazaki | 438/487 |
| 6,825,069 B2 * | 11/2004 | Abe | 438/149 |
| 2003/0032222 A1 | 2/2003 | Okumura | |

FOREIGN PATENT DOCUMENTS

| | | |
|---|---|---|
| JP | 11-274095 | 10/1999 |
| JP | 11-298005 | 10/1999 |
| JP | 2000-012484 | 1/2000 |
| JP | 2000-286195 | 10/2000 |
| JP | 2001-035806 | 2/2001 |
| JP | 2001-044120 | 2/2001 |
| JP | 2003-068644 | 3/2003 |

* cited by examiner

*Primary Examiner*—Carl Whitehead, Jr.
*Assistant Examiner*—Monica D. Harrison
(74) *Attorney, Agent, or Firm*—Leydig, Voit & Mayer, Ltd.

(57) ABSTRACT

A method for manufacturing a thin-film semiconductor includes polycrystallization to focus visible light pulse laser into a line shape on a surface of an object to be irradiated, and repeat irradiation with displacing the visible light pulse laser such that a line-shaped irradiated region is overlapped with a region irradiated at a next timing in a width direction of the line-shaped irradiated region, to form a polycrystalline silicon film on the surface of the object. The step of polycrystallization applies ultraviolet light pulse laser onto a second irradiated region partially overlapping the first irradiated region while or before the visible light pulse laser is applied to the first irradiated region.

13 Claims, 15 Drawing Sheets

METHOD AND APPARATUS FOR PRODUCING POLYCRYSTALLINE SILICON FILM AND METHOD OF MANUFACTURING SEMICONDUCTOR DEVICE AND THIN-FILM TRANSISTOR

TECHNICAL FIELD

The present invention relates to a method and an apparatus for manufacturing a thin-film semiconductor, and in particular, to a technique for recrystallization using laser irradiation.

BACKGROUND ART

A polycrystalline silicon thin-film transistor has been known in which a polycrystalline silicon film is formed as a semiconductor layer on the surface of an insulating substrate, and the semiconductor layer is used instead of a conventional semiconductor substrate. In such a polycrystalline silicon thin-film transistor, a silicon crystal grain boundary limits carrier mobility, and thus it is desirable to uniformly form polycrystalline silicon having a grain size as large as possible. However, it has been difficult for a so-called laser recrystallization technique, in which amorphous silicon as a starting material is heated and melted by irradiation with laser, then recrystallized when being cooled, to control the temperature of a silicon melted portion stimulating crystal growth. Therefore, it has been difficult to form crystals having a large grain size stably and uniformly.

With respect to the above, first, there is a technique disclosed in Japanese Patent Laying-Open No. 2000-12484 (patent document 1). In patent document 1, amorphous silicon is irradiated with an overlap of a first pulse laser beam having a wavelength in a visible range and a second pulse laser beam having a wavelength in an ultraviolet range generated by subjecting the first pulse laser beam to wavelength conversion into its second harmonic, and the second pulse laser beam is applied to be included in the first pulse laser beam in terms of time and space on the amorphous silicon to suppress dissipation of heat quantity from the silicon melted with the second pulse laser beam. Thereby, the temperature of a melted portion is controlled to form a polycrystalline silicon film having a relatively large grain size.

Second, there is a technique disclosed in Japanese Patent Laying-Open No. 2000-286195 (patent document 2). In patent document 2, an Nd:YAG2ω laser beam, which is visible light laser, is used. The laser beam is focused in a form of a fine line having a light intensity distribution in a substantially Gaussian shape in a width direction, and applied as a laser beam having an energy density gradient of a certain level or more on amorphous silicon. In this technique, a visible laser beam having a low absorption coefficient in amorphous silicon is employed to suppress a temperature gradient in a film thickness direction and to form a temperature gradient intentionally in the width direction, causing a one-dimensional lateral growth. With this structure, a polycrystalline silicon film having an array of crystals having a large grain size is obtained.

Patent document 1: Japanese Patent Laying-Open No. 2000-12484

Patent document 2: Japanese Patent Laying-Open No. 2000-286195

DISCLOSURE OF THE INVENTION

Problems to be Solved by the Invention

In the example of the above patent document 1, heating with the first pulse laser beam is overlapped to extend a time period for which the melted silicon cools, and thus a time period for crystal growth is also extended, producing large crystals. However, since the second pulse laser beam melting the amorphous silicon is ultraviolet light and a temperature gradient in a film thickness direction is generated within the melted silicon film, the crystals grow in the film thickness direction. As a result, the size of the crystals is limited by the film thickness.

In the example of the above patent document 2, the crystals grow laterally instead of growing in the film thickness direction, because a laser beam of visible light (hereinafter referred to as "visible laser") is used. Accordingly, a larger grain size can be achieved without being limited by the film thickness. However, since the beam is formed to have a distribution in a Gaussian shape in the width direction, lateral crystal growth occurs simultaneously at gradient portions on both sides of the Gaussian-shaped distribution of the beam. Although crystallization is performed sequentially also in the example of patent document 2 by overlapping fine-lined laser beams in the width direction and sequentially moving a position to be irradiated to crystallize an entire surface of the amorphous silicon as in a general laser recrystallization technique, visible light is absorbed very little in a crystalline portion once formed by the gradient portion on a front side in a moving direction because polycrystalline silicon of excellent quality is formed there, and thus it is not possible to apply heat quantity enough to melt it again just by applying the first pulse laser beam. As a result, since polycrystalline silicon arrays formed on the both sides of the gradient portions of the Gaussian-shaped distribution are present independently and grain boundary between the arrays has a poor quality, carrier mobility is not improved in spite of the large grain size.

Means for Solving the Problems

One object of the present invention is to provide a method and an apparatus for manufacturing a thin-film semiconductor capable of forming a polycrystalline silicon film having a large grain size stably and without being limited by a film thickness.

To achieve the foregoing object, the method for manufacturing a thin-film semiconductor in accordance with the present invention includes the step of polycrystallization to focus visible light pulse laser into a line shape on a surface of an object to be irradiated, and repeat irradiation with displacing the visible light pulse laser such that a line-shaped irradiated region is overlapped with a region irradiated at a next timing in a width direction of the line-shaped irradiated region, to form a polycrystalline silicon film on the surface of the object, and the step of polycrystallization applies ultraviolet light pulse laser onto a second irradiated region partially overlapping the first irradiated region while or before the visible light pulse laser is applied to the first irradiated region.

Effects of the Invention

According to the present invention, while the surface of the object is melted with an overlap of the first and the second pulse laser beams, the portion irradiated with the second pulse laser beam becomes amorphous, forming an extremely excellent polycrystalline silicon film in a desired region by scanning. In particular, crystals laterally growing over the entire surface of the irradiated object are allowed to have an identical direction in which the crystals grow. Furthermore, since an end of the laterally growing portion is melted again and next lateral growth proceeds starting from it, crystal growth becomes substantially continuous, significantly improving crystalline property.

BEST MODE FOR CARRYING OUT THE INVENTION

Figure 1:
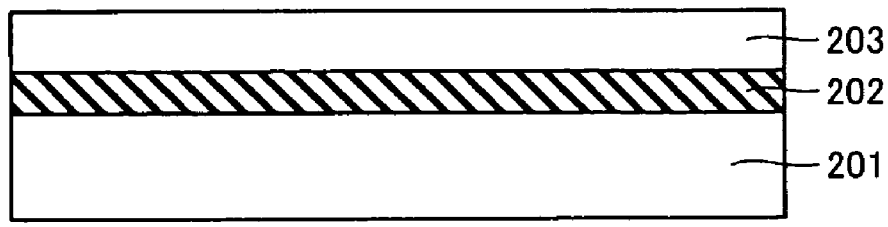
FIG. 1 is a view illustrating a first step of a method for manufacturing a semiconductor device using a method for manufacturing a thin-film semiconductor in accordance with the present invention.

Referring to FIGS. 1 to 5, explanation will be given with regard to a situation in which a method and an apparatus for manufacturing a thin-film semiconductor in accordance with the present invention are used. As shown in FIG. 1, a base film 202 is formed of a silicon oxide film or the like on an upper surface of an insulating substrate 201, using CVD (Chemical Vapor Deposition) technique. Base film 202 serves as a barrier preventing impurities within insulating substrate 201 from diffusing into a polycrystalline silicon film to be formed hereafter. Further, an amorphous silicon film 203 is formed thereon to cover base film 202.

Figure 2:
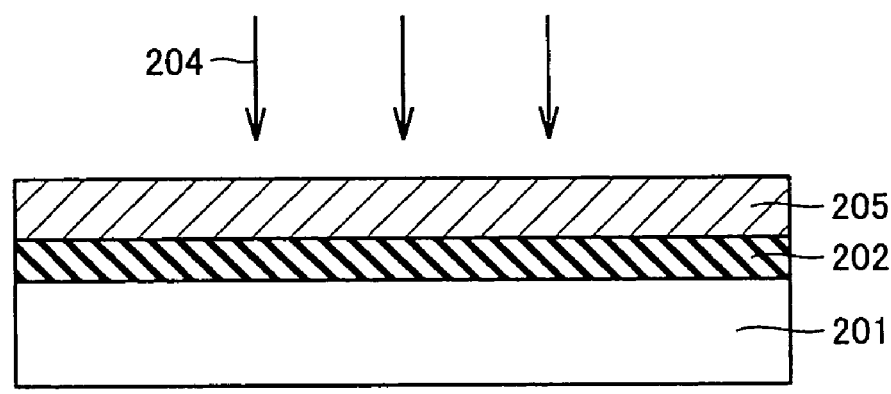
FIG. 2 is a view illustrating a second step of the method for manufacturing a semiconductor device using the method for manufacturing a thin-film semiconductor in accordance with the present invention.
Figure 3:
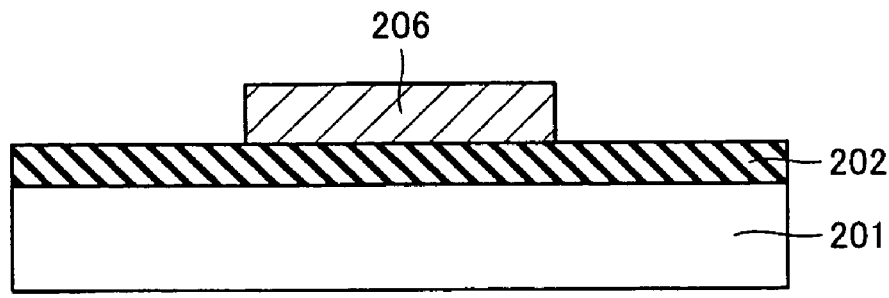
FIG. 3 is a view illustrating a third step of the method for manufacturing a semiconductor device using the method for manufacturing a thin-film semiconductor in accordance with the present invention.

As shown by an arrow 204 in FIG. 2, a first laser beam having a wavelength in a visible range of not less than 350 nm and a second laser beam having a wavelength in an ultraviolet range of less than 350 nm are applied as laser beams. This laser beam irradiation heats amorphous silicon film 203 to melt it. When such melted silicon cools down and solidifies, a polycrystalline silicon film 205 is formed. Thereafter, as shown in FIG. 3, a patterned polycrystalline silicon film 206 is formed in an island shape, using photolithography technique.

Figure 4:
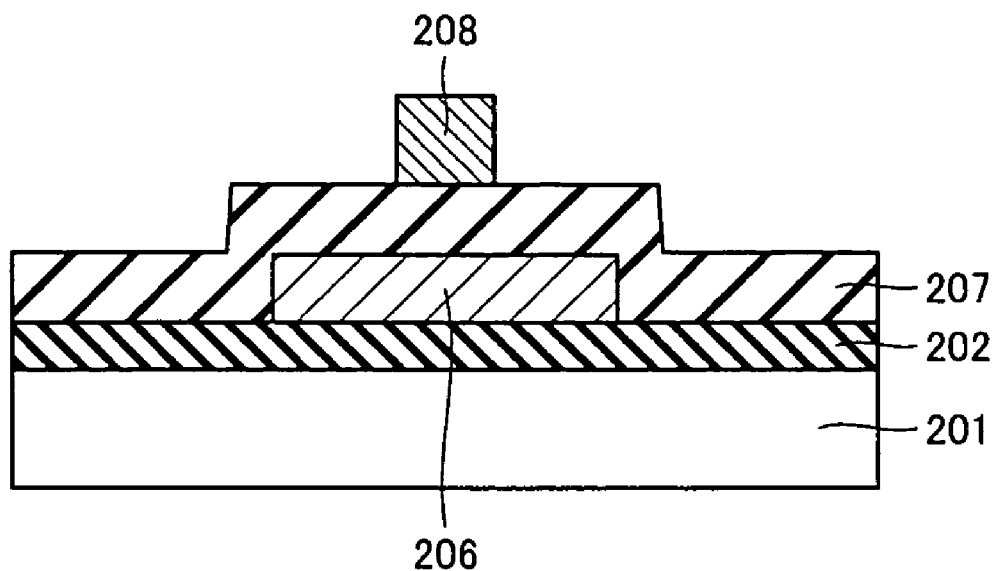
FIG. 4 is a view illustrating a fourth step of the method for manufacturing a semiconductor device using the method for manufacturing a thin-film semiconductor in accordance with the present invention.
Figure 5:
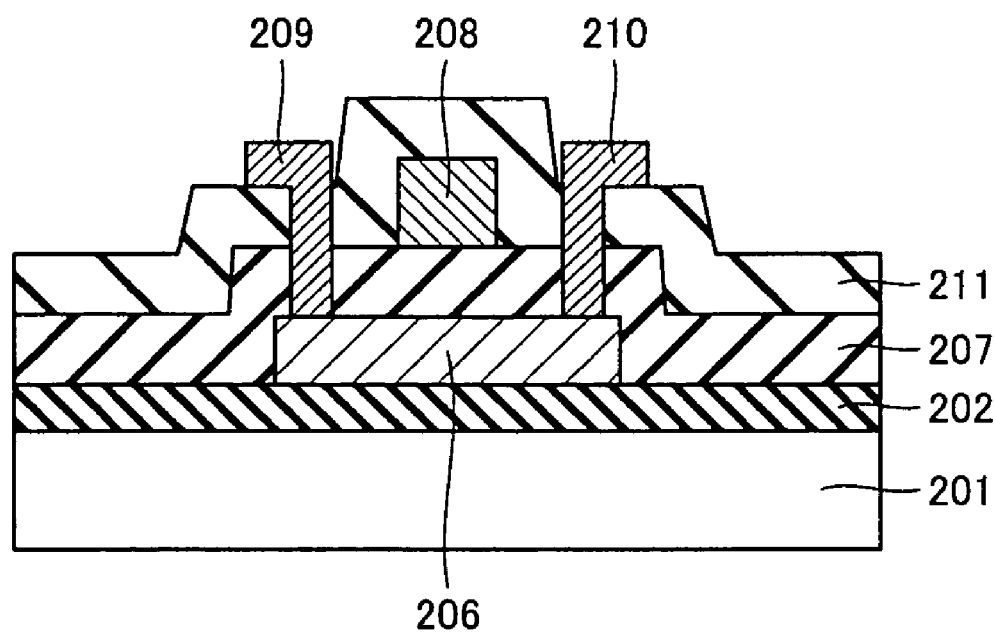
FIG. 5 is a view illustrating a fifth step of the method for manufacturing a semiconductor device using the method for manufacturing a thin-film semiconductor in accordance with the present invention.

As shown in FIG. 4, a silicon oxide film is formed as a gate insulating film 207, and a gate electrode 208 is formed thereon. As shown in FIG. 5, a silicon oxide film or a silicon nitride film is formed as an interlayer insulating film 21 1, and a source electrode 209 and a drain electrode 210 are formed. In this manner, a thin-film transistor using polycrystalline silicon film 206 as a semiconductor layer is fabricated.

The present invention mainly pays attention to the step from FIG. 1 to FIG. 2, that is, the step of melting amorphous silicon film 203 by applying the laser beams and then cooling and solidifying it to, form polycrystalline silicon film 205. Hereinafter, this step will be described in detail.

First Embodiment

Figure 6:
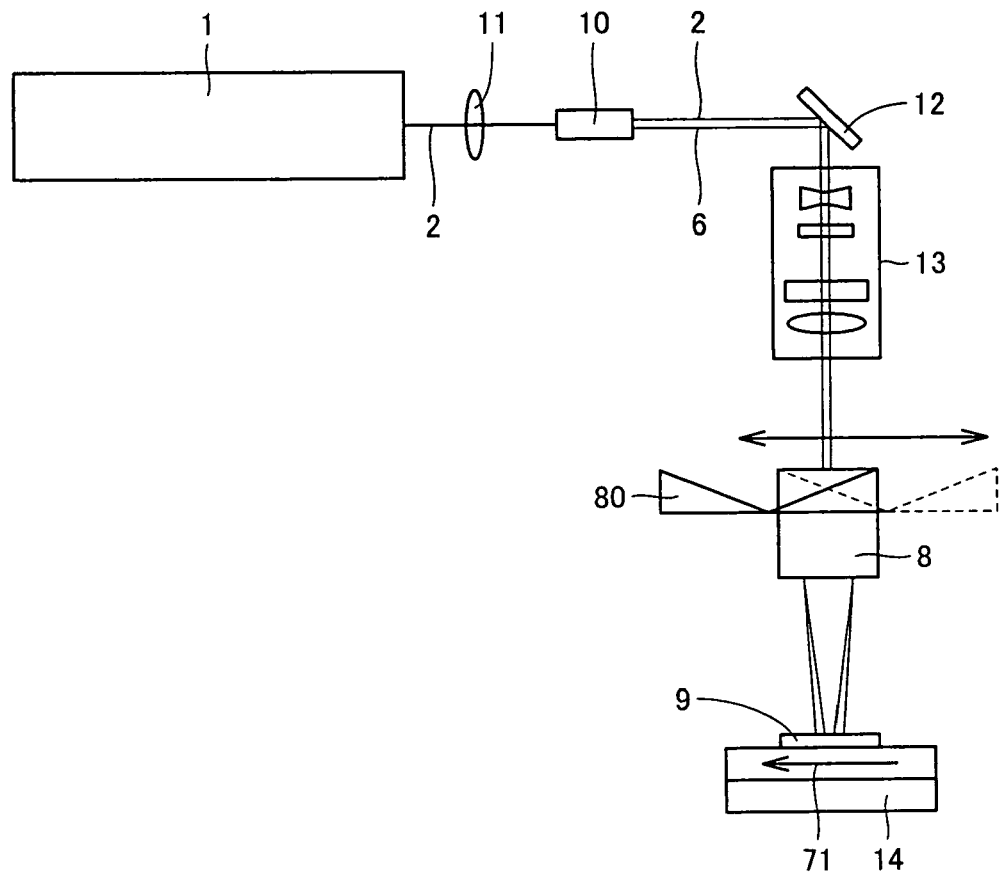
FIG. 6 is a conceptual diagram of an apparatus for manufacturing a thin-film semiconductor in a first embodiment in accordance with the present invention.

Referring to FIG. 6, explanation will be given on a laser annealing apparatus, which is an apparatus of manufacturing a thin-film semiconductor in a first embodiment in accordance with the present invention. The laser annealing apparatus includes a pulse laser beam source 1. Pulse laser beam source 1 generates a first pulse laser beam 2 having a wavelength in a visible range. Specifically, the first pulse laser beam 2 is an argon pulse laser beam having an oscillation wavelength of 515 nm. An object 9 to be irradiated is that shown in FIG. 1. Amorphous silicon film 203 on its upper surface is partially melted by being irradiated with the laser beam, and then recrystallized to form a polycrystalline polysilicon film.

Along a beam path from pulse laser beam source 1 to object 9 to be irradiated, a focusing lens 11, a non-linear optical element 10, a bend mirror 12, a beam adjusting optical system 13, and a focusing and irradiation optical system 8 are arranged in order of mention. Non-linear optical element 10 subjects part of the first pulse laser beam 2 to wavelength conversion to generate a second pulse laser beam 6 having a wavelength in an ultraviolet range, and emits the second pulse laser beam 6 to coaxially overlap with the first pulse laser beam 2. Although the first pulse laser beam 2 and the second pulse laser beam 6 on the right side of non-linear optical element 10 are represented in FIG. 6 as two parallel straight lines due to illustrative limitations, these two laser beams actually have an identical optical axis.

Focusing lens 11 enhances light intensity of the first pulse laser beam 2 incident on non-linear optical element 10 to improve the efficiency of wavelength conversion into ultraviolet light in non-linear optical element 10. Bend mirror 2 bends a direction in which the first pulse laser beam 2 and the second pulse laser beam 6 emitted from non-linear optical element 10 travel, at a right angle. Focusing and irradiation optical system 8 is focusing means for focusing the first pulse laser beam 2 and the second pulse laser beam 6 for irradiation to object 9. Object 9 is located on a stage 14, which is means for moving the object. Stage 14 is designed to be movable from side to side and up and down.

The first pulse laser beam 2 and the second pulse laser beam 6 emitted from non-linear optical element 10 are bent by bend mirror 12 at a right angle, and then enter focusing and irradiation optical system 8. Thus, each of the first pulse laser beam 2 and the second pulse laser beam 6 is focused into a line shape. In this manufacturing apparatus, the height of object 9 is adjusted by stage 14 such that a focal point of the second pulse laser beam 6 is located on sample 9 to be irradiated.

Pulse laser beam source 1 in the manufacturing apparatus uses argon laser in the visible range having an oscillation wavelength of 515 nm to generate the first pulse laser beam 2 by pulsing the argon laser with a Q switch. Non-linear optical element 10 uses a β-BBO (β-BaB$_2$O$_4$, beta barium borate) crystal. In non-linear optical element 10, the surface of the β-BBO crystal is cut to satisfy a phase matching condition when the first pulse laser beam 2, which is a beam having a wavelength of 515 nm, is received to generate the second pulse laser beam 6, which is a double harmonic of the first pulse laser beam 2. Accordingly, the second pulse laser beam 6 becomes ultraviolet light having a wavelength of 258 nm. Further, although not shown, non-linear optical element 10 is equipped with adjustment means according to a temperature and an installation angle.

The manufacturing apparatus is provided with visible light pulse laser irradiation means constituted by a combination of pulse laser beam source 1, focusing and irradiation optical system 8, and the like, to focus visible light pulse laser into a line shape on the surface of substrate-like object 9, and to repeat irradiation with displacing the visible light pulse laser in such a manner that an irradiated region is overlapped with a region irradiated at a next timing in a width direction of the longitudinal irradiated region. Further, the manufacturing apparatus is provided with ultraviolet light pulse laser irradiation means constituted by a combination of pulse laser beam source 1, non-linear optical element 10, focusing and irradiation optical system 8, and the like, to apply ultraviolet pulse laser onto a second irradiated region partially overlapping a first irradiated region while or before the visible light pulse laser is applied onto the first irradiated region.

Referring to FIGS. 7 to 16, a method for manufacturing the thin-film semiconductor in the first embodiment in accordance with the present invention will be described.

This manufacturing method includes the step of polycrystallization. In the step of polycrystallization, the first pulse laser beam 2, which is the visible light pulse laser, is focused into a line shape on substrate-like object 9 by focusing and irradiation optical system 8, and repeatedly applied with being gradually displaced in such a manner that an irradiated region is overlapped with a region irradiated at the next timing in the width direction of the longitudinal irradiated region, to form polycrystalline silicon film 205 (see FIG. 2) on the surface of object 9.

In this manufacturing method, however, not only the first pulse laser beam 2 but also the second pulse laser beam 6 are applied. Therefore, detailed description will be given on how these two pulse laser beams travel.

The first pulse laser beam 2 emitted from pulse laser beam source 1 is focused by focusing lens 11 to enter non-linear optical element 10. Since non-linear optical element 10 is cut to satisfy the phase matching condition when generating a double harmonic as described above, part of the first pulse laser beam 2 incident on non-linear optical element 10 is subjected to wavelength conversion into a double harmonic, and becomes the second pulse laser beam 6 having a wavelength in the ultraviolet range. Since the second pulse laser beam 6 is generated along the beam path of the first pulse laser beam 2, the second pulse laser beam 6 can be considered as being generated coaxially with the first pulse laser beam 2, if a displacement in a traveling direction due to a walk-off is set aside.

The first pulse laser beam 2 and the second pulse laser beam 6 emitted from non-linear optical element 10 are bent at right angles by identical bend mirror 12 to enter beam adjusting optical system 13. Beam adjusting optical system 13, having a plurality of cylindrical convex lenses and cylindrical concave lenses, expands beam diameters of the first pulse laser beam 2 and the second pulse laser beam 6 and decreases their beam divergence angles.

The components from non-linear optical element 10 to focusing and irradiation optical system 8 constitute a laser transmitting portion transmitting the first pulse laser beam 2 having a wavelength in the visible light range and the second pulse laser beam 6 having a wavelength in the ultraviolet range such that both of the beams travel on an identical optical axis.

The first pulse laser beam 2 and the second pulse laser beam 6 incident on focusing and irradiation optical system 8 are each focused into a line shape. Since focusing and irradiation optical system 8 includes a pair of prisms 80 arranged symmetrically with respect to the optical axis, it is designed to have different emitting angles depending on the difference in the wavelengths of the first pulse laser beam 2 and the second pulse laser beam 6. In the present embodiment, such a function of focusing and irradiation optical system 8 is utilized to apply the beams in such a manner that the focal point of the second pulse laser beam 6 is displaced from that of the first pulse laser beam 2 and is always on a rear side in a direction in which object 9 moves. Due to the difference in the wavelengths, the first pulse laser beam 2 and the second pulse laser beam 6 suffer from chromatic aberration, and have different focal points. In this manufacturing method, the height of sample 9 is adjusted by stage 14 such that the focal point of the second pulse laser beam 6 having a wavelength in the ultraviolet range is located on object 9.

Figure 7:
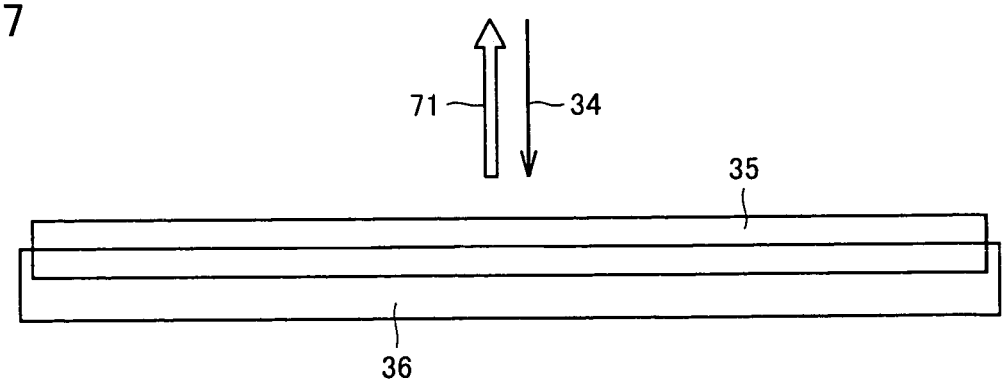
FIG. 7 is a view illustrating how regions irradiated with first and second pulse laser beams overlap each other on an irradiated object according to a manufacturing method in the first embodiment in accordance with the present invention.

FIG. 7 shows a pattern of the regions irradiated with the first pulse laser beam 2 and the second pulse laser beam 6 produced on object 9 by the manufacturing method in the present embodiment. A region 36 irradiated with the second pulse laser beam 6 overlaps a region 35 irradiated with the first pulse laser beam 2, generally by half. In FIG. 7, an arrow 71 indicates a direction in which object 9 moves. An arrow 34 indicates a direction in which region 35 irradiated with the first pulse laser beam 2 eventually scans the surface of object 9. Region 36 irradiated with the second pulse laser beam 6 is focused such that it is located on a rear side in the direction in which object 9 moves. Further, in a longitudinal direction, that is, in a side-to-side direction in FIG. 7, it is preferred that region 36 irradiated with the second pulse laser beam 6 has the same length as region 35 irradiated with the first pulse laser beam 2, or preferably, has a longer length.

Figure 8:
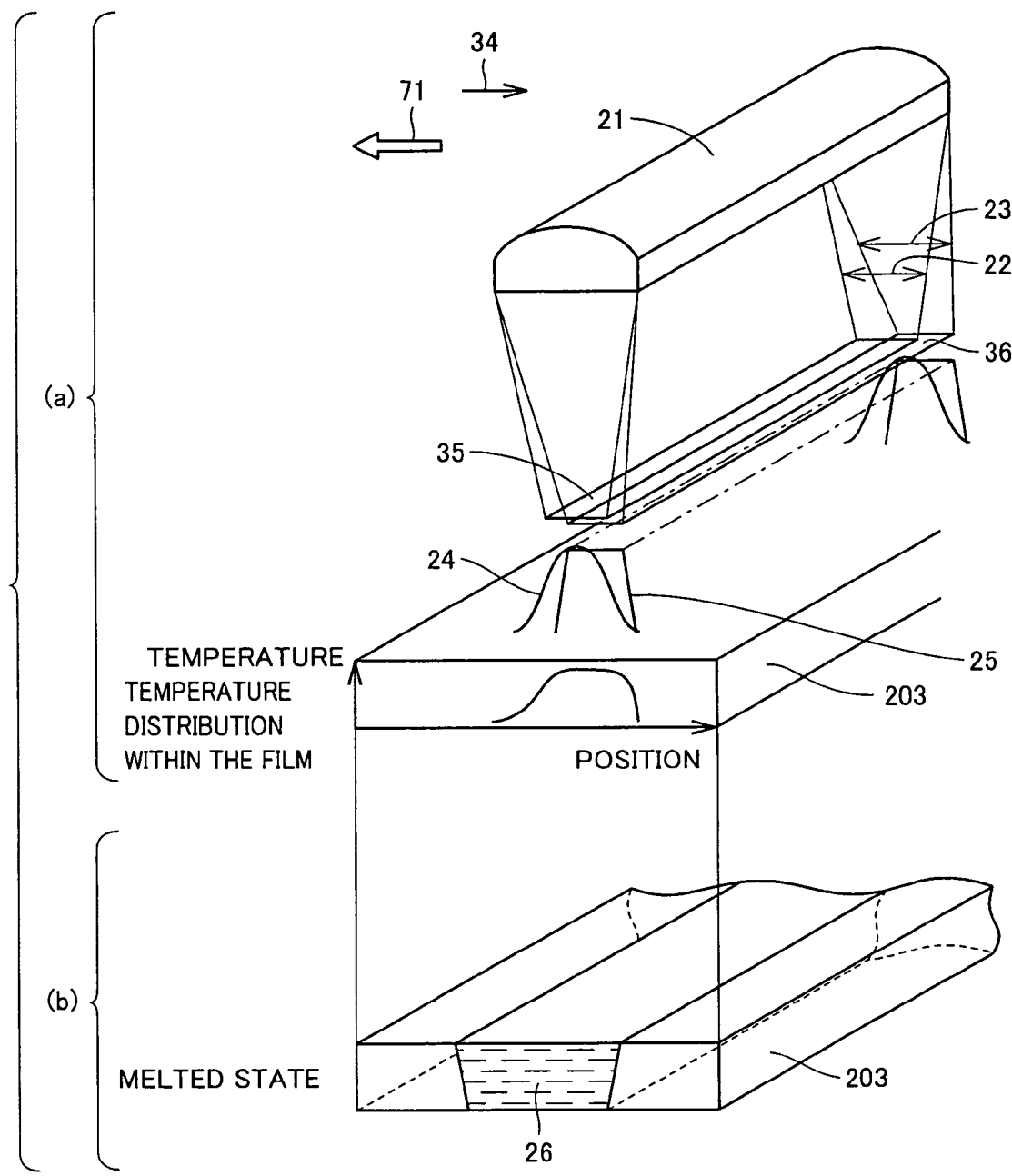
FIG. 8 is a view illustrating a step of scanning irradiation included in the method for manufacturing a thin-film semiconductor in the first embodiment in accordance with the present invention.

FIG. 8 shows a conceptual diagram illustrating that a first pulse laser beam 22 emitted from a focusing lens 21 is applied to amorphous silicon film 203 to melt it. The first pulse laser beam 22 in FIG. 8 (a) is what the first pulse laser beam 2 (see FIG. 6). is focused into a line shape by focusing lens 21 provided within focusing and irradiation optical system 8.

The line-shaped first pulse laser beam 22 is applied to region 35 on amorphous silicon film 203, and FIG. 8(a) shows a profile 24 of energy density of the first pulse laser beam 22 on that occasion. Profile 24 is uniform with almost no variation, that is, has a top-flat shape, in the longitudinal direction of irradiated region 35, and it has substantially a Gaussian distribution shape in the width direction of irradiated region 35.

Figure 9:
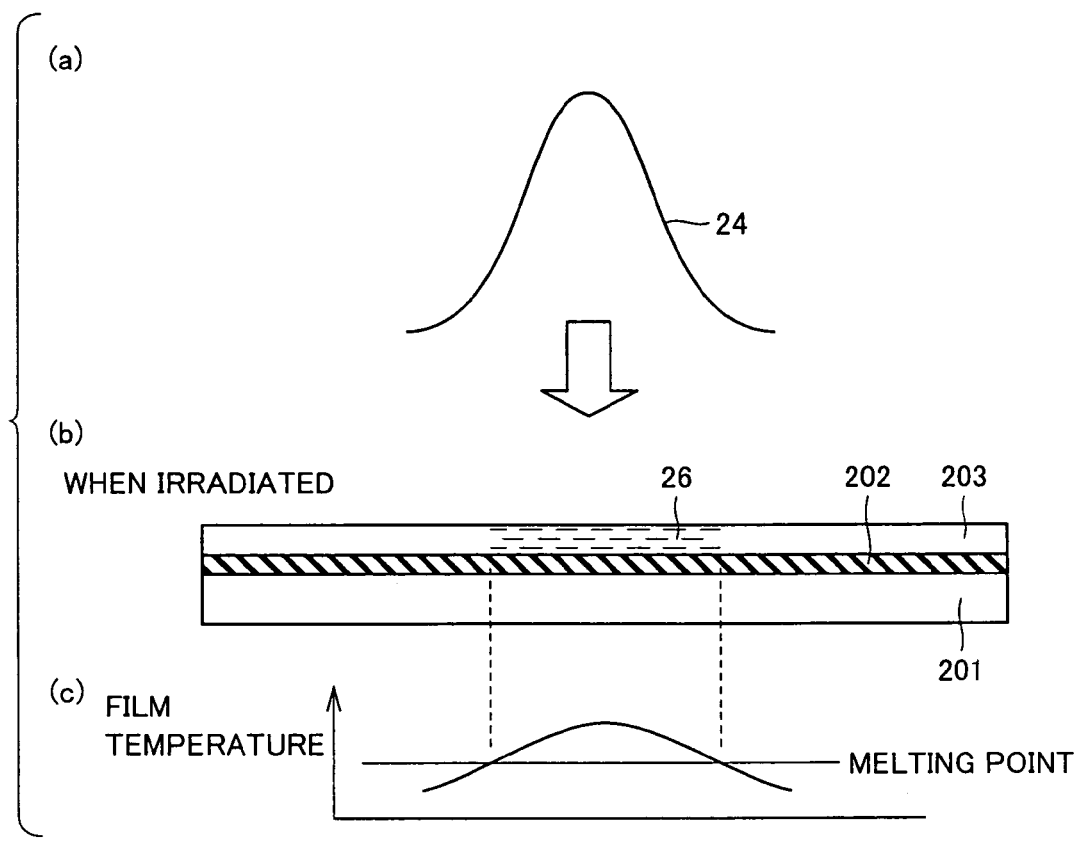
FIG. 9 is a view illustrating that the first pulse laser in the first embodiment in accordance with the present invention is applied. Specifically, (a) is a graph of a profile of an energy density distribution in a width direction when the first pulse laser beam is applied singularly, (b) is a cross sectional view showing that a melted portion is produced in the irradiated object by the first pulse laser beam, and (c) is a graph showing a temperature distribution inside the irradiated object.

When heat treatment is performed with argon laser having such profile 24, amorphous silicon film 203 is heated almost uniformly in a film thickness direction, because the argon laser has a low absorption coefficient with respect to amorphous silicon. A temperature distribution in a lateral direction within the silicon film generated by this laser irradiation is formed only in the width direction of the line-shaped beam. A temperature gradient in the lateral direction within the silicon film generated by this laser irradiation is formed only in the width direction of line-shaped irradiated region 35. Accordingly, as shown in FIG. 8(b), a portion of amorphous silicon film 203 covering the surface of object 9 irradiated with a beam of not less than a predetermined intensity is melted entirely in a depth direction. Specifically, a melted portion 26 extending entirely in the depth direction is produced in a line-shaped local region. FIG. 9 shows such a state seen from another angle. By the irradiation of a laser beam having profile 24 shown in FIG. 9(a), amorphous silicon film 203 obtains a temperature distribution shown in FIG. 9(c) therein, and amorphous silicon is melted only in a portion where the temperature exceeds a melting point, the portion being melted portion 26 as shown in FIG. 9(b).

Figure 10:
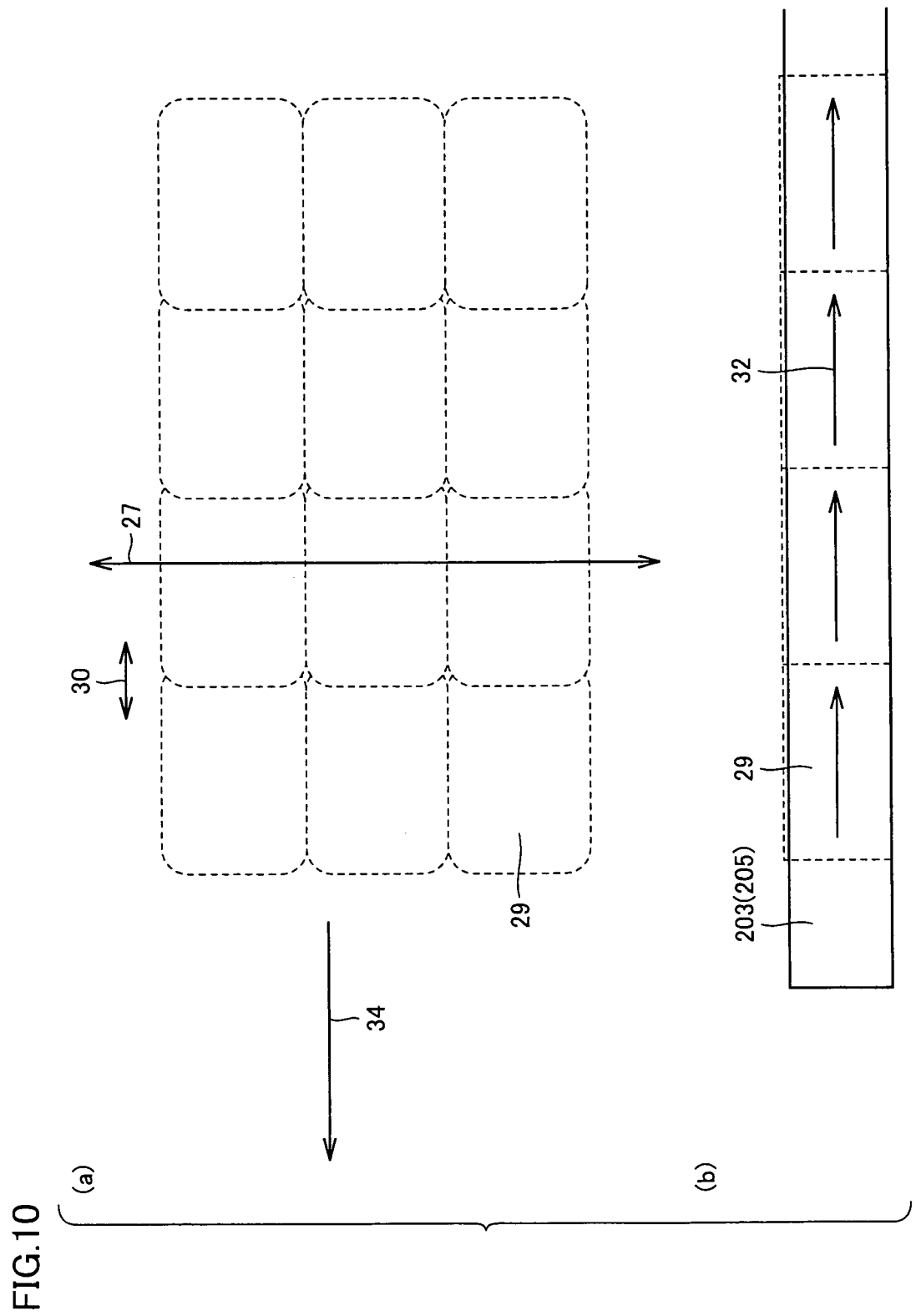
FIG. 10 is a view illustrating crystal grains growing through the step of scanning irradiation included in the method for manufacturing a thin-film semiconductor in the first embodiment in accordance with the present invention.
Figure 11:
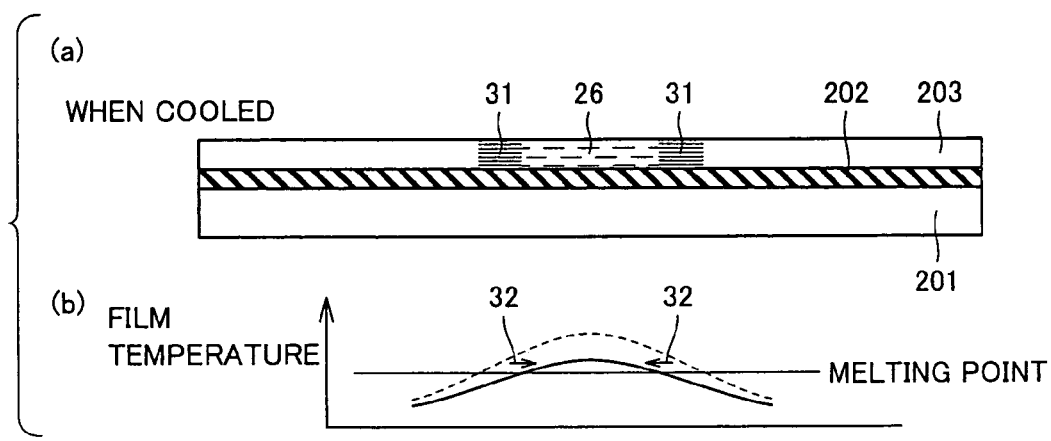
FIG. 11 is a view illustrating that the crystal grains grow laterally through the step of scanning irradiation included in the method for manufacturing a thin-film semiconductor in the first embodiment in accordance with the present invention.

Since the temperature gradient is low in the depth direction and in the longitudinal direction of the line-shaped irradiated region 35 (see FIG. 8(a)), crystal growth occurs laterally and one-dimensionally in the width direction of irradiated region 35, forming a large crystal grain 29 having a grain size of the order of several micrometers as shown in FIG. 10. Further, since the crystal growth occurs in the width direction of irradiated region 35, crystal grains 29 of the polycrystalline silicon film formed by this laser irradiation align in a width direction 30 of the irradiated region as shown in FIG. 10(a). FIG. 10(b) is a cross sectional view of a portion recrystallized in this manner. Since there is almost no temperature gradient in the depth direction, the entire portion is uniformly crystallized in the film thickness direction.

The process of the lateral crystal growth in the heat treatment with a pulse laser beam having a wavelength of not less than 350 nm as described above is significantly affected by the temperature distribution in the lateral direction within the silicon film. Specifically, it is significantly affected by an energy density distribution in the width direction of the applied line-shaped beam. Heat introduced into the silicon film by laser beam irradiation is uniformly dissipated into elsewhere in object 9. Specifically, a curve representing the temperature distribution in the lateral direction within the silicon film uniformly declines as shown in FIG. 11(b). Therefore, as indicated by an arrow 32 in FIG. 11(b), the crystal growth occurs laterally, from a portion in which the temperature falls below the melting point first to a portion in which the temperature falls below the melting point later. Thus, a laterally growing crystal 31 is formed as shown in FIG. 11(a).

This lateral crystal growth stops when it is blocked by microcrystals grown through natural nucleation as the temperature falls. Therefore, to obtain a crystal having a large grain size as laterally growing crystal 31, it is preferred that a crystal grain grows as long as possible until when the natural nucleation occurs. For that purpose, a high crystal growth rate is required. Generally, a crystal growth rate v in a minute region is represented by $v = k\Delta T/\Delta x$, where k is a rate constant, $\Delta T$ is a temperature difference in the minute region, and $\Delta x$ is a width of the minute region. Specifically, when there is a temperature difference in a lateral direction within a silicon film, a high crystal growth rate is obtained if a temperature distribution in a region having a temperature of not less than a melting point has a steep gradient, and as a result, a polycrystalline silicon film having a large grain size can be formed. Taking this into consideration, the temperature distribution in the lateral direction within the silicon film can obtain a steep gradient by causing an irradiation energy density distribution on a target surface to have a steep gradient.

Figure 12:
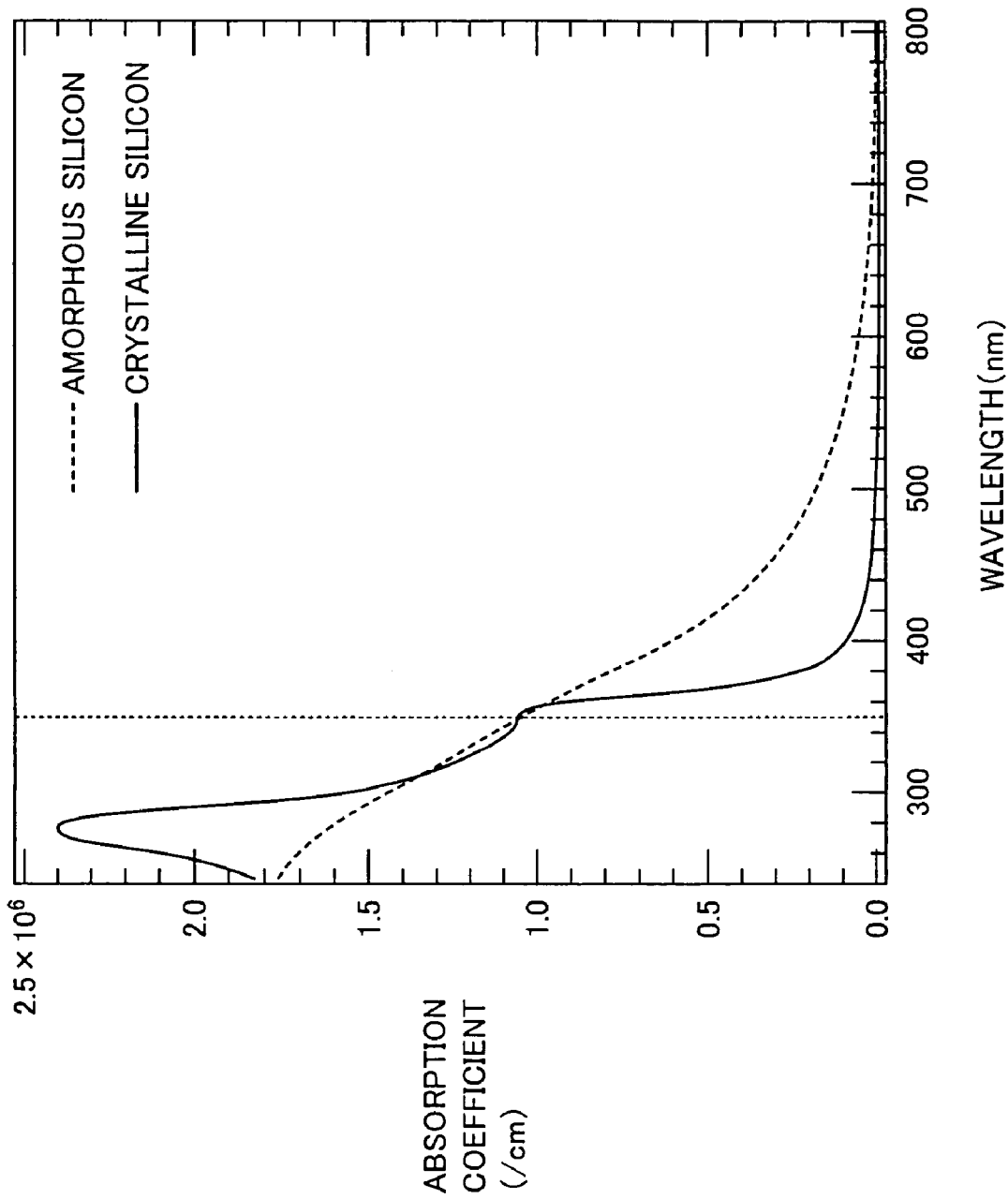
FIG. 12 is a graph showing relation between a wavelength and an absorption coefficient.

Since the first pulse laser beam 22 has a profile in the width direction in a Gaussian distribution shape, the irradiation energy density distribution on the surface of amorphous silicon film 203 described above has two steep gradient portions in total on both sides in the width direction. Crystals laterally growing at these two respective portions grow toward a central portion in the width direction. To make the entire surface of substrate-like object 9 to be polycrystalline silicon film 205, object 9 is moved in the direction indicated by arrow 71 shown in FIG. 8(a) so that the first pulse laser beam 22 scans the surface of object 9 relatively in the direction indicated by arrow 34. In this scan, however, with respect to a point on object 9, two steep gradient portions of region 35 (see FIG. 8(a)) irradiated with the first pulse laser beam 22, located on a rear side and a front side in the direction in which object 9 moves, pass by the point in order of mention. Thus, a crystal portion formed by the steep gradient portion of irradiated region 35 on the rear side in the direction in which object 9 moves is irradiated again with the steep gradient portion on the front side in the direction in which object 9 moves, resulting in alternation of crystalline property. Further, as shown in FIG. 12, an absorption ratio of a laser beam of not less than 350 nm in silicon significantly decreases in a portion of crystalline silicon, as compared with amorphous silicon.

Therefore, an extremely complicated temperature profile was formed within the silicon film depending on the quality of crystals formed by irradiation performed immediately before, failing to produce uniform crystals.

Figure 13:
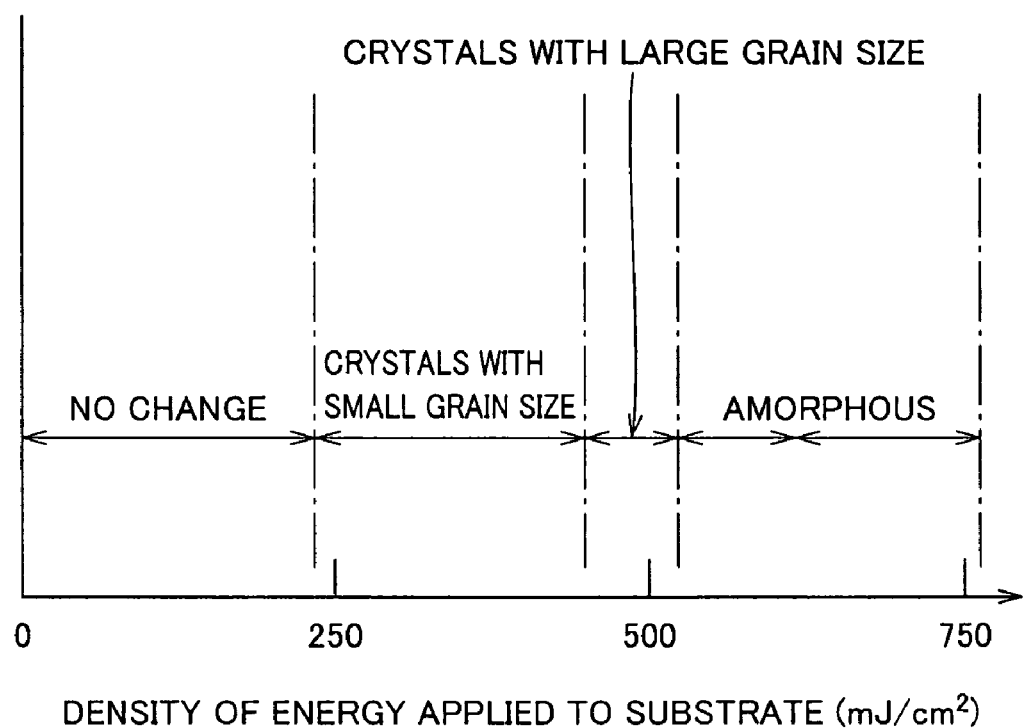
FIG. 13 is a graph showing relation between irradiation energy density of the second pulse laser beam and a state of the crystals formed after irradiation.

Meanwhile, when the second pulse laser beam having an ultraviolet wavelength is applied to the silicon film, its absorption coefficient in amorphous silicon is nearly equal to that in crystalline silicon, and its absolute value is significantly high when compared with a beam having a visible wavelength of not less than 350 nm. Accordingly, energy is absorbed on the surface regardless of the quality of the silicon film to be irradiated and a large temperature distribution is generated in the film thickness direction, causing no lateral growth. FIG. 13 shows relation between irradiation energy density of the second pulse laser beam having an ultraviolet wavelength and a state of crystals formed after irradiation. Each state of the crystals shown in this graph was observed through an optical microscope. This experiment obtained a result that, with an irradiation energy density exceeding approximately 600 mJ/cm$^2$, amorphous silicon was produced regardless of the state of the silicon film before irradiation.

Details of an Apparatus for Manufacturing a Thin-film Semiconductor

The manufacturing apparatus in the present embodiment is designed to irradiate object 9 with the first pulse laser beam 22 formed by focusing the first pulse laser beam 2 into a line shape and a second pulse laser beam 23 formed by focusing the second pulse laser beam 6 into a line shape, as shown in FIG. 8. The manufacturing apparatus, however, is structured to irradiate object 9 with the first pulse laser beam 22 having a wavelength in the visible range, and almost simultaneously irradiate a portion in which profile 24 has a steep gradient on the rear side in the direction in which object 9 moves with the second pulse laser beam 23 formed by focusing the second pulse laser beam 6 having a wavelength in the ultraviolet range into a line shape. In FIG. 8(a), arrow 71 indicates the direction in which object 9 actually moves, and arrow 34 indicates the direction in which the first pulse laser beam 22 and the second pulse laser beam 23 relatively scan the surface of object 9.

It is to be noted that the irradiation energy density of the second pulse laser beam 23 has energy higher than that for crystallization. In the present embodiment, this requirement can be satisfied if approximately 40 percent of the energy of pulse laser beam source 1 is converted into the second pulse laser.

Figure 14:
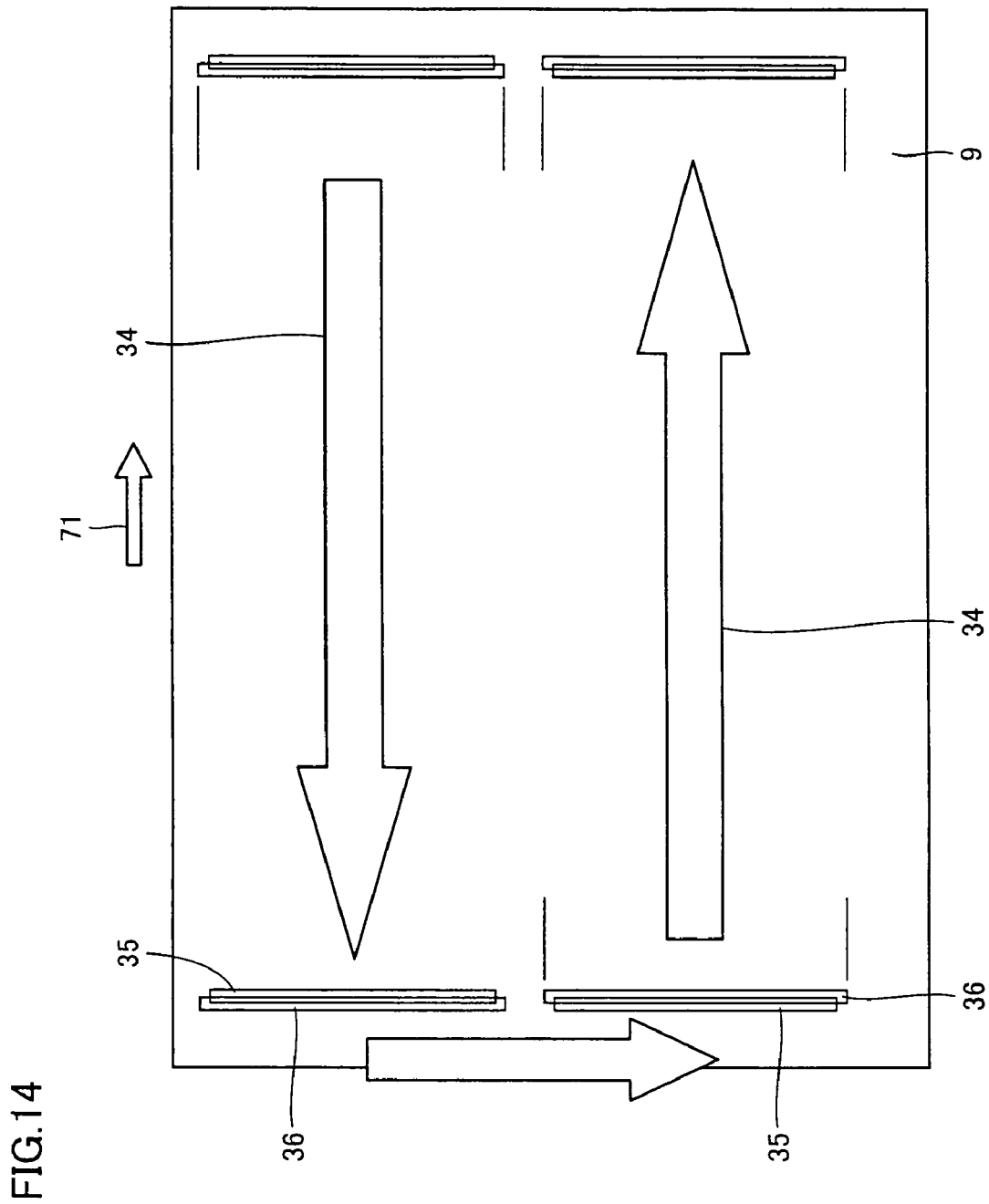
FIG. 14 is a view illustrating that the surface of the irradiated object is scanned in a zigzag in the step of polycrystallization included in the method for manufacturing a thin-film semiconductor in the first embodiment in accordance with the present invention.
Figure 15:
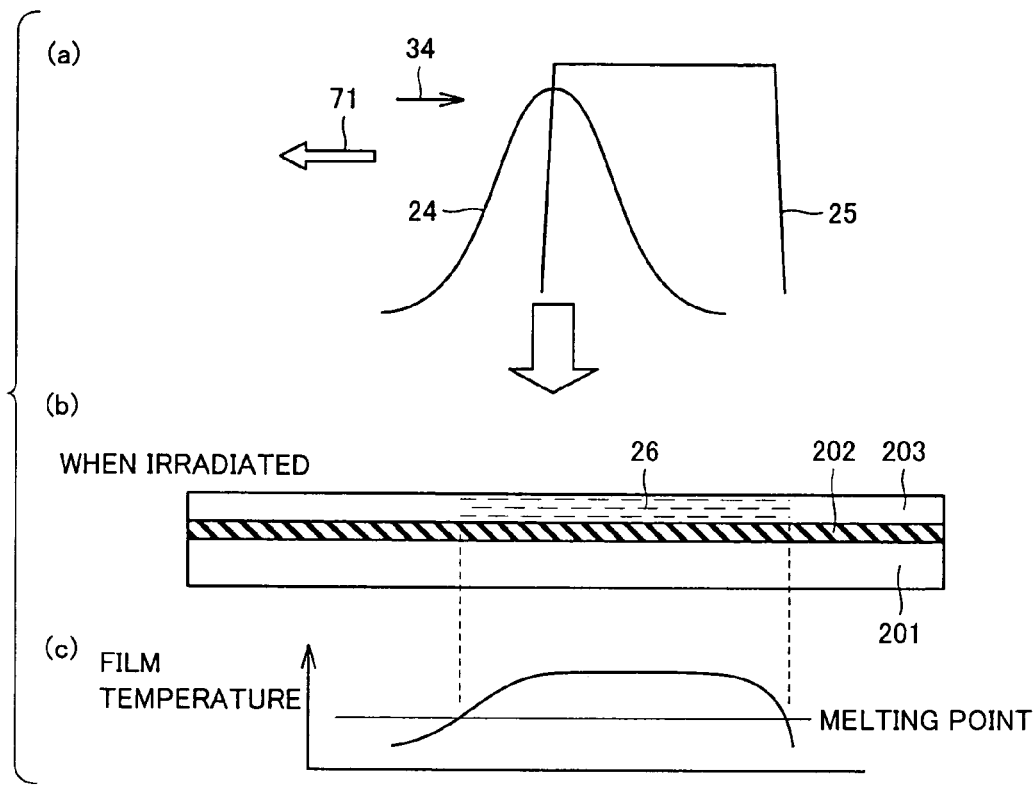
FIG. 15 is a view illustrating that the first and the second pulse laser beams in the first embodiment in accordance with the present invention are applied to partially overlap each other. Specifically, (a) is a graph of profiles of energy density distributions in the width direction of the first and the second pulse laser beams, (b) is a cross sectional view showing that a melted portion is produced in the irradiated object by an overlap of the first and the second pulse laser beams, and (c) is a graph showing a temperature distribution inside the irradiated object.

In the present embodiment, focusing and irradiation optical system 8 includes the pair of prisms 80 arranged symmetrically with respect to the optical axis. The pair of prisms 80 is means for differentiating the irradiated regions. By sliding the pair of prisms 80, the second pulse laser beam 23 can be applied to the steep gradient portion on either side of profile 24 of the first pulse laser 22 in a Gaussian distribution shape. For example, when polycrystalline silicon film 205 is to be formed to entirely cover object 9 as a substrate, the entire surface of object 9 may be scanned in a zigzag as shown in FIG. 14 for entire irradiation, and in this case, the scanning direction is reversed every time one line is scanned. By sliding and switching prisms 80 when the scanning direction is reversed a direction in which an optical axis of the second pulse laser beam 23 is displaced from that of the first pulse laser 22 can be changed. With such a structure, the second pulse laser beam can always be applied to the steep gradient portion of profile 24 of the first pulse laser on the rear side in the direction in which object 9 moves.

In other words, to form a polycrystalline silicon film on the surface of object 9 as a substrate, the apparatus for manufacturing a thin-film semiconductor in the present embodiment includes: the visible light pulse laser irradiation means to focus the first pulse laser beam 2, which is the visible light pulse laser, into a line shape on the surface of object 9 to form the first pulse laser beam 22, and repeat irradiation with displacing the visible light pulse laser in such a manner that line-shaped region 35 irradiated with the first pulse laser beam 22 is overlapped with a region irradiated at a next timing in the width direction of irradiated region 35; and the ultraviolet light pulse laser irradiation means to apply the second pulse laser beam 23, which is the ultraviolet pulse laser, onto the second irradiated region 36 partially overlapping the first irradiated region while the visible light pulse laser is applied to the first irradiated region 35.

Operation and Effect

Figure 16:
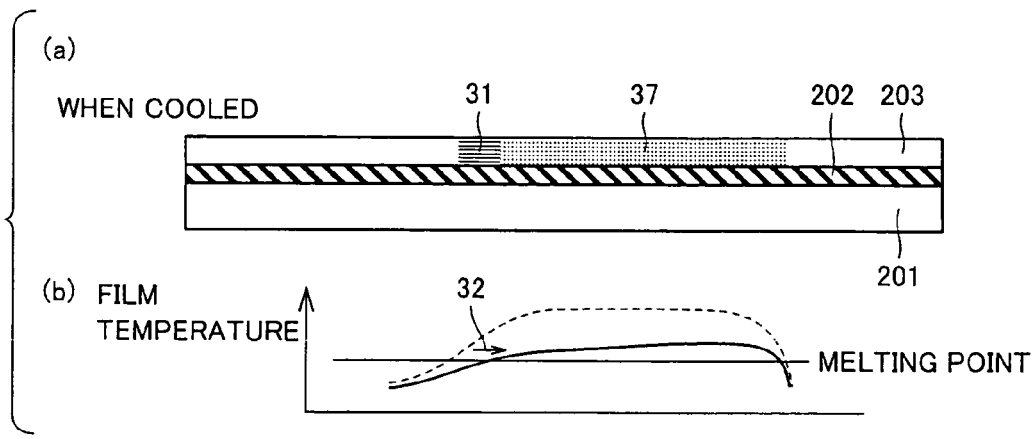
FIG. 16 is a view illustrating that the crystal grains grow laterally through the step of polycrystallization included in the method for manufacturing a thin-film semiconductor in the first embodiment in accordance with the present invention.

FIG. 15(a) is an enlarged view of profiles 24 and 25 in FIG. 8(a). By irradiation with profiles 24 and 25 overlapped in this manner, a larger range is melted as compared with the case using profile 24 only (see FIG. 9), forming melted portion 26. It has been found that, by scanning with such an overlap of profiles 24 and 25, crystallization does not occur at the steep gradient portion on the rear side in the direction in which object 9 moves (the right side in FIG. 16) as shown in FIG. 16, and the portion irradiated with the second pulse laser beam becomes amorphous. As the scanning of object 9 further proceeds, the amorphous portion is irradiated with the steep gradient portion of the first pulse laser beam 22 on the front side in the direction in which object 9 moves, forming significantly uniform laterally growing crystals 31. Such scanning has made it possible to form extremely excellent polycrystalline silicon film 205 (see FIG. 2) in a desired region.

Further, in the present embodiment, the crystals laterally growing over the entire surface of object 9 can have an identical crystal growing direction (see FIG. 10). Generally, crystals have a better crystalline property as they grow. In the present embodiment, silicon in the amorphous portion adjacent to an end of the laterally growing portion is melted again, and next lateral growth proceeds starting from it. Accordingly, crystals grow substantially continuously, significantly improving the crystalline property. Furthermore, in the present embodiment, it has also been found that a grain boundary formed at an end portion of each crystal grain 29 has less elevation.

By arranging and using the apparatus for manufacturing a thin-film semiconductor as described above, or by using the method for manufacturing a thin-film semiconductor as described above, amorphous silicon film 203 on the surface of object 9 can be altered to a polycrystalline silicon film, and further, the crystalline property of the obtained polycrystalline silicon film can be highly improved.

Second Embodiment

Figure 17:
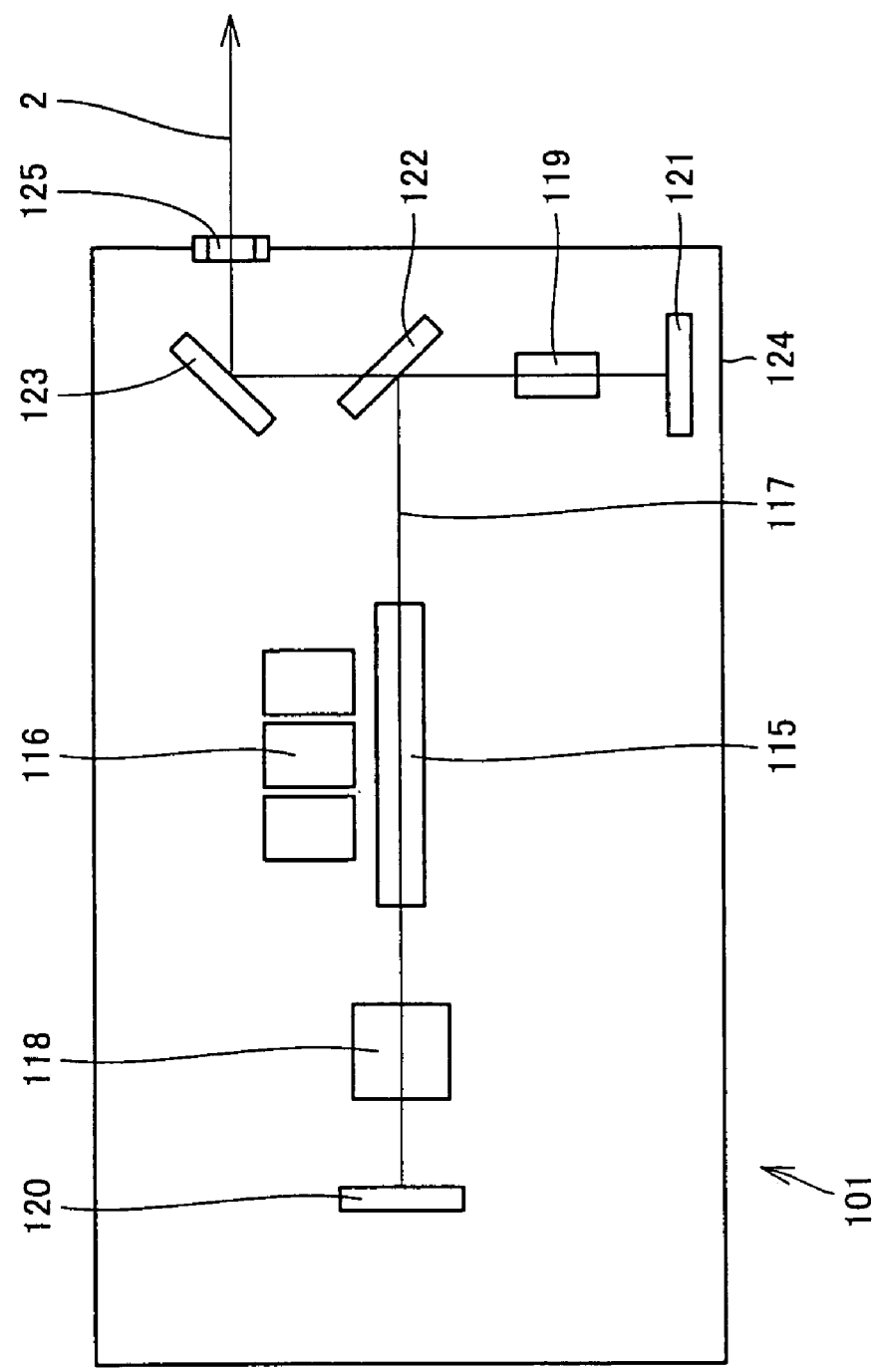
FIG. 17 is a conceptual diagram of an internal wavelength conversion-type solid-state laser device included in an apparatus for manufacturing a thin-film semiconductor in a second embodiment in accordance with the present invention.

Referring to FIG. 17, explanation will be given on a laser annealing apparatus, which is an apparatus for manufacturing a thin-film semiconductor in a second embodiment in accordance with the present invention. FIG. 17 is a conceptual diagram of an internal wavelength conversion-type solid-state laser device 101 used as pulse laser beam source 1 in the apparatus for manufacturing a thin-film semiconductor. The apparatus for manufacturing a thin-film semiconductor in the present embodiment is identical to the one in the first embodiment (see FIG. 6), except that internal wavelength conversion-type solid-state laser device 101 is included as pulse laser beam source 1. Description of parts identical to those in the first embodiment will not be repeated.

As shown in FIG. 17, internal wavelength conversion-type solid-state laser device 101 includes a solid-state laser medium 115, which is a solid-state element used as an active medium. In the present embodiment, a YAG (yttrium aluminum garnet) crystal doped with neodymium ions is used as solid-state laser medium 115. On a side of solid-state laser medium 115 is located a semiconductor laser element 116 for exciting solid-state laser medium 115. Solid-state laser medium 115 excited by semiconductor laser element 116 emits a fundamental wave laser beam 117 in a near-infrared range with a wavelength of 1064 nm. On an optical path of fundamental wave laser beam 117 is located a Q switch 118 for providing pulsed fundamental wave laser beam 117. A first end mirror 120 and a second harmonic extraction mirror 122 are provided as sandwiching solid-state laser medium 115 and Q switch 118 therebetween. A second end mirror 121 is provided at a position to which light reflected from the second harmonic extraction mirror 122 is directed. Between the second harmonic extraction mirror 122 and the second end mirror 121 is provided a second harmonic generating non-linear optical element 119 which subjects fundamental wave laser beam 117 to wavelength conversion to generate the second harmonic. In the present embodiment, a KTP (KTiOPO$_4$, potassium phosphate titanate) crystal is used in the second harmonic generating non-linear optical element 119. The surface of the second harmonic generating non-linear optical element 119 is cut to satisfy the phase matching condition when a double harmonic is generated upon receiving light with a wavelength of 1064 nm. Accordingly, the second harmonic is obtained as visible light with a wavelength of 532 nm. Further, although not shown, the second harmonic generating non-linear optical element 119 is provided with means for adjusting a temperature and an installation angle.

Within internal wavelength conversion-type solid-state laser device 101, a resonator having the first end mirror 120 as one end and the second end mirror 121 as the other end is constituted, and Q switch 118, solid-state medium laser 115 and the second harmonic extraction mirror 122 are located on an optical path of the resonator. The second harmonic generating non-linear optical element 119 is also provided on the optical path within the resonator, constituting wavelength conversion means within the resonator. The first end mirror 120 is provided with total reflection coating for allowing fundamental wave laser beam 117 with a wavelength of 1064 nm to be totally reflected. The second end mirror 121 is provided with total reflection coating for allowing both fundamental wave laser beam 117 with the wavelength of 1064 nm and the second harmonic with a wavelength of 532 nm to be totally reflected. For the second harmonic extraction mirror 122, two-wavelength coating is applied to totally reflect fundamental wave laser beam 117 with the wavelength of 1064 nm and totally transmit the second harmonic with the wavelength of 532 nm, in order to bend the optical axis and extract the second harmonic from the resonator. On a side opposite to the second harmonic generating non-linear optical element 119 across the second harmonic extraction mirror 122 is provided a bend mirror 123 for bending the direction in which the second harmonic extracted from the second harmonic extraction mirror 122 travels. A case 124 for internal wavelength conversion-type solid-state laser 101 is provided with a beam extraction window 125 for extracting the second harmonic light. With Q switch 118, the amount of light loss within the resonator can be changed.

Next, description will be given on the operation. First, excitation light emitted from semiconductor laser 116 is applied to solid-state laser medium 115 from a side of the optical axis of solid-state laser medium 115, to excite solid-state laser medium 115. Within excited solid-state laser medium 115, population inversion is caused between specific energy levels according to a wavelength of the excitation light and an atomic structure of the active medium. Although the population inversion is decreased by natural emission and induced emission, light intensity within the resonator cannot be increased when the light loss caused by Q switch 118 located within the resonator is significant, and thus a decrease in the population inversion by the induced emission is negligible. Accordingly, as long as the amount of the population inversion increased by excitation exceeds the amount of the population inversion decreased by the natural emission, the population inversion is increased and high energy is accumulated within solid-state laser medium 115. When the amount of the light loss caused by Q switch 118 is quickly reduced with high energy accumulated within solid-state laser medium 115, naturally emitted light generated within solid-state laser medium 115 is confined within the resonator by the first end mirror 120 and the second end mirror 121. Further, under the action of amplification caused by the induced emission of solid-state laser medium 115, light intensity of fundamental wave laser beam 117 within the resonator is increased quickly. Since the occurrence rate of the induced emission is proportional to the intensity of the light passing through solid-state laser medium 115, the induced emission becomes prominent when fundamental wave laser beam 117 having high light intensity passes through solid-state laser medium 115, causing a decrease in the population inversion below a threshold value. As a result, fundamental wave laser beam 117 within the resonator stops oscillation. As described above, pulse light having high peak light intensity can be generated by providing Q switch 118 within the resonator to increase or decrease the light loss within the resonator. Particularly, in the present embodiment, fundamental wave laser beam 117 is structured to be confined within the resonator including the first end mirror 120 and the second end mirror 121, and thus fundamental wave laser beam 117 within the resonator has extremely high light intensity.

In the present embodiment, the second harmonic generating non-linear optical element 119 is located within the resonator and fundamental wave laser beam 117 is confined within the resonator by the first end mirror 120 and the second end mirror 121, allowing fundamental wave laser beam 117 having extremely high peak light intensity to enter the second harmonic generating non-linear optical element 119. In the second harmonic generating non-linear optical element 119, the rate at which fundamental wave laser beam 117 is converted to the second harmonic is theoretically proportional to the square of the light intensity of fundamental wave laser beam 117. According to the wavelength conversion structure within a resonator having the wavelength conversion means described in the present embodiment within an optical path of the resonator, high-intensity fundamental wave laser beam 117 can be entered into the second harmonic generating non-linear optical element 119 to generate the second harmonic light efficiently.

The second harmonic generated within the resonator is extracted from the resonator by the second harmonic extraction mirror 122 provided within the resonator. The direction in which the second harmonic emitted from the resonator travels is bent by bend mirror 123, and the second harmonic is emitted through beam extraction window 125 out of case 124. The second harmonic emitted out of case 124, having a wavelength in the visible range, is used for annealing as the first pulse laser beam 2 in the laser annealing apparatus, which is an apparatus for manufacturing a thin-film semiconductor in accordance with the present invention.

It is to be noted that the method for generating the second pulse laser beam 6, the method for transmitting it to object 9, and the method for applying it to object 9 are identical to those in the structure described in the first embodiment, except that non-linear optical element 10 is cut to satisfy the phase matching condition when a double harmonic is generated upon receiving light having a wavelength of 532 nm.

In the present embodiment, solid-state laser medium 115 is used to generate fundamental wave laser beam 117 in the near-infrared range, and fundamental wave laser beam 117 pulsed by Q switch 118 is subjected to wavelength conversion by the second harmonic generating non-linear optical element 119 to generate the second harmonic having a wavelength in the visible range to be used for annealing as the first pulse laser beam 2. Thus, by subjecting the fundamental wave laser beam generated from the solid-state laser medium to wavelength conversion into visible light and using it for annealing as the first pulse laser beam, the same effect as in the first embodiment can be obtained. In addition, unlike gas laser such as the argon laser used as the light source for the first pulse laser beam 2 in the first embodiment, the light source for generating the first pulse laser beam can be downsized. Further, since the first pulse laser beam 2 can be generated more efficiently as compared to the case using gas laser, running cost during annealing can be reduced and high-quality annealing can be performed inexpensively.

Since the argon laser described in the first embodiment excites a gas medium with electrons being discharged, it cannot avoid consumption of an electrode for discharge generation, and it cannot be said as being sufficiently excellent in terms of life and long-term reliability. If solid-state laser medium 15 is used as described in the present embodiment, however, not only long-term reliability is significantly improved but also output stability is enhanced, making it possible to reduce maintenance cost and perform annealing with stable quality over a long term. Further, since solid-state laser medium 15 can provide high output more easily as compared to a gas laser, productivity in the annealing operation can be readily improved.

Although an example of using a YAG crystal as solid-state laser medium 115 has been described in the present embodiment, the material for solid-state laser medium 115 is not limited to this. For example, if a YLF (LiYF$_4$) crystal doped with neodymium ions is used, fundamental wave laser beam 117 in the near-infrared range having a wavelength of 1047 nm or 1052 nm is obtained. Further, since the YLF crystal has a longer life of natural emission than that for the YAG crystal, it can accumulate energy efficiently within solid-state laser medium 115 when fundamental wave laser beam 117 is pulsed by Q switch 118. Furthermore, the YLF crystal has less change in a refractive index associated with temperature change in solid-state laser medium 115, improving stability in laser output and beam quality. Solid-state laser medium 115 is not limited to the YAG crystal and the YLF crystal described herein, and any medium having an oscillation wavelength in the near-infrared range may be applied. The best crystal may be selected according to a condition required for annealing.

Furthermore, although the structure in which wavelength conversion is performed within the resonator to generate the second harmonic of the solid-state laser medium has been described in the present embodiment, the second harmonic generating non-linear optical element 119 may be provided outside the resonator and wavelength conversion may be performed outside the resonator to generate the second harmonic to be used for annealing as the first pulse laser beam 2, provided that the light intensity of fundamental wave laser beam 117 can be maintained sufficiently high even if fundamental wave laser beam 117 is extracted outside the resonator. If the second harmonic generating non-linear optical element 119 is provided outside the resonator, alignment of the resonator is facilitated and output stability is further improved, maintaining the quality of an annealed object more readily.

Further, although the structure using semiconductor laser element 116 as the light source for exciting solid-state laser medium 115 has been described in the present embodiment, an arc lamp may be used as a light source for exciting solid-state laser medium 115. When the arc lamp is used as an excitation light source, while it is inferior to semiconductor laser 116 in terms of long-term reliability, it is less expensive than semiconductor laser 116 and thus cost for manufacturing a laser annealing apparatus can be reduced.

Although the structure using the second harmonic of solid-state laser medium 115 as the first pulse laser beam 2 and generating the double harmonic of the first pulse laser beam 2 to generate the second pulse laser beam 6 having a wavelength in the ultraviolet range has been described in the present embodiment, the means for generating the second pulse laser beam 6 having a wavelength in the ultraviolet range is not limited to double harmonic generation. For example, when the second harmonic of solid-state laser medium 115 is used as the first pulse laser beam 2, fundamental wave laser beam 117 and the second harmonic as the first pulse laser beam 2 of solid-state laser medium 115 may be caused to enter non-linear optical element 10 simultaneously to perform sum frequency mixing, and a triple harmonic of the fundamental wave laser beam having a wavelength in the ultraviolet range may be used as the second pulse laser beam 6. Since a thermal load on the non-linear optical element performing wavelength conversion is increased as wavelength-converted light generated has a shorter wavelength, if the triple harmonic of fundamental wave laser beam 117 is used as the second pulse laser beam 6, the thermal load on non-linear optical element 10 generating the second pulse laser beam 6 is reduced as compared to the case where the double harmonic of the second harmonic of fundamental wave laser beam 117, that is, a quadruple harmonic of fundamental wave laser beam 117, is used as the second pulse laser beam 6. Accordingly, reliability as a laser annealing apparatus is improved.

Although the Q switch is used to generate a pulsed laser beam in the first and the second embodiments, the method for generating a pulsed laser beam is not limited to this. For example, a pulse laser beam applicable to annealing can also be obtained by using a pulsed operation to excite a laser beam source.

Third Embodiment

Figure 18:
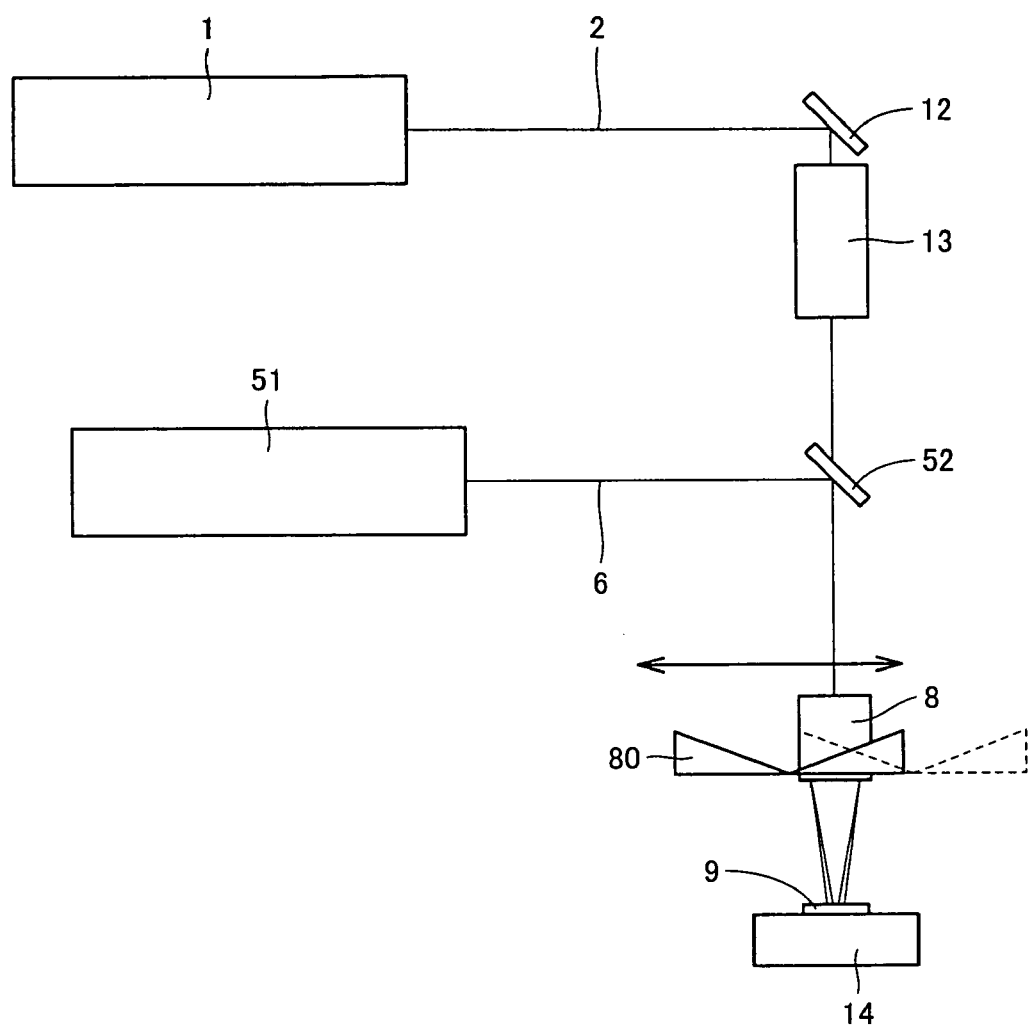
FIG. 18 is a conceptual diagram of an apparatus for manufacturing a thin-film semiconductor in a third embodiment in accordance with the present invention.

Referring to FIG. 18, explanation will be given on a laser annealing apparatus, which is an apparatus for manufacturing a thin-film semiconductor in a third embodiment in accordance with the present invention. The apparatus for manufacturing a thin-film semiconductor obtains the second pulse laser beam having a wavelength in the ultraviolet range by adopting a pulse laser beam source 51, another beam source independent of pulse laser beam source 1, instead of extracting a harmonic from pulse laser beam source 1 generating the first pulse laser beam 2. Pulse laser beam source 51 is an ultraviolet laser beam source, and a XeCl excimer laser having a wavelength of 308 nm. To coaxially overlap the second pulse laser beam 6 emitted from pulse laser beam source 51 on the first pulse laser beam 2, a dichroic mirror 52 is provided between pulse laser beam source 1 and focusing and irradiation optical system 8 to transmit the first pulse laser beam 2 with almost no loss and to effectively reflect the second pulse laser beam 6, matching the optical axis of the first pulse laser beam 2 and that of the second pulse laser beam 6. Further, oscillation timings of these two laser beam sources are synchronized by a timing controller for irradiation onto object 9 with almost the same timing.

Even when the sources for the first and the second pulse laser beams are present separately as in the present embodiment, irradiation identical to that in the first embodiment can be performed to obtain an identical effect.

In the present embodiment, the second pulse laser beam 6 can be generated independent of the first pulse laser beam 2, eliminating the non-linear optical element for subjecting the first pulse laser beam 2 to wavelength conversion into the second pulse laser beam 6. Therefore, reliability as a laser annealing apparatus is improved.

Although XeCl is used as the second pulse laser beam having a wavelength in the ultraviolet range in the present embodiment, the type of the laser is not limited to this, and an identical effect can be obtained when pulse laser having an oscillation wavelength of less than 350 nm is used.

Fourth Embodiment

Figure 19:
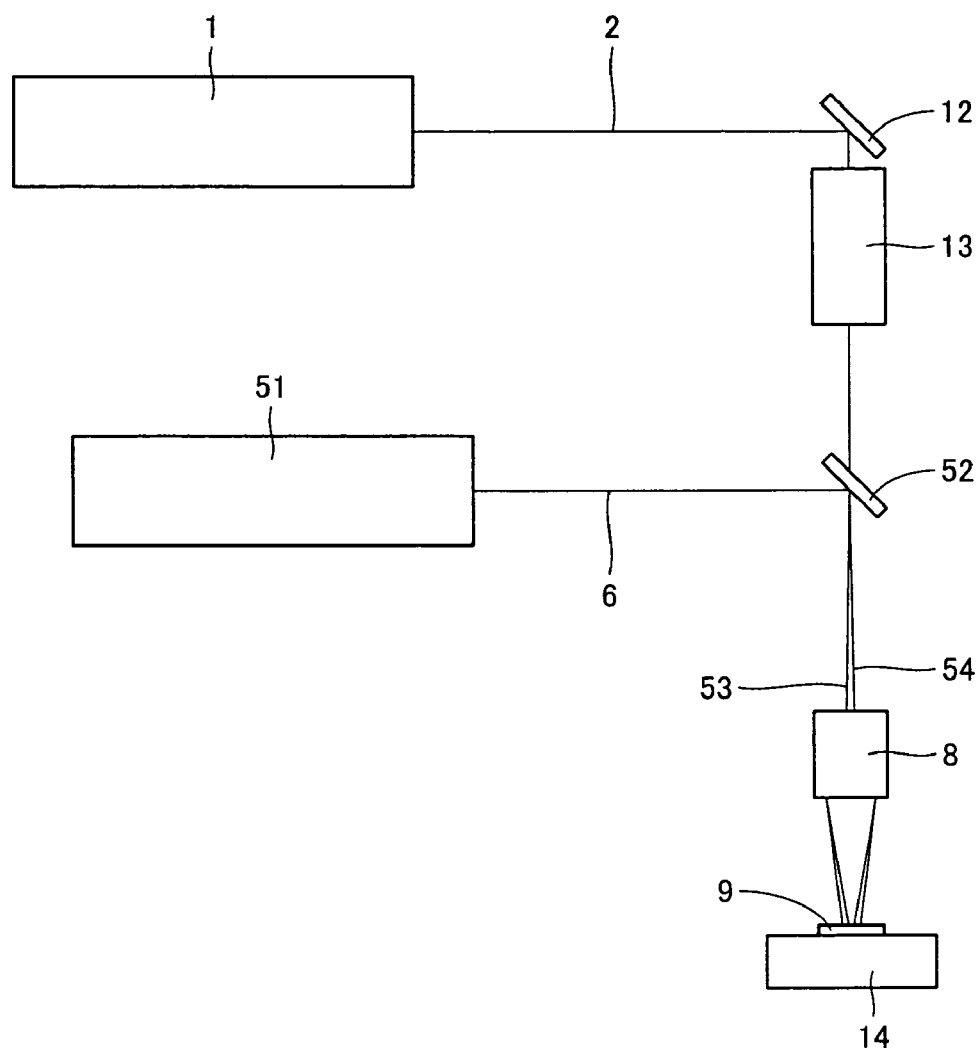
FIG. 19 is a conceptual diagram of an apparatus for manufacturing a thin-film semiconductor in a fourth embodiment in accordance with the present invention.

Referring to FIG. 19, explanation will be given on an apparatus for manufacturing a thin-film semiconductor in a fourth embodiment in accordance with the present invention. While dichroic mirror 52 matches the optical axis of the first pulse laser beam 2 and that of the second pulse laser beam 6 to be identical in the apparatus for manufacturing a thin-film semiconductor in the third embodiment, the optical axes of the respective beams emitted from dichroic mirror 52 have slightly different directions in the apparatus of the fourth embodiment. This angle difference is set such that the region irradiated with the second pulse laser beam overlaps the region irradiated with the first pulse laser beam almost by half on the surface of object 9, and is located on the rear side in the direction in which object 9 moves.

In the present embodiment, dichroic mirror 52 is means for differentiating the irradiated regions.

Also in this case, irradiation identical to those in the first and the third embodiments can be performed. Also in the present embodiment, effects identical to those in the embodiments described above can be obtained. Furthermore, since prisms 80 of focusing and irradiation optical system 8 is not required in the present embodiment, the apparatus for manufacturing a thin-film semiconductor can be implemented inexpensively.

Fifth Embodiment

Figure 20:
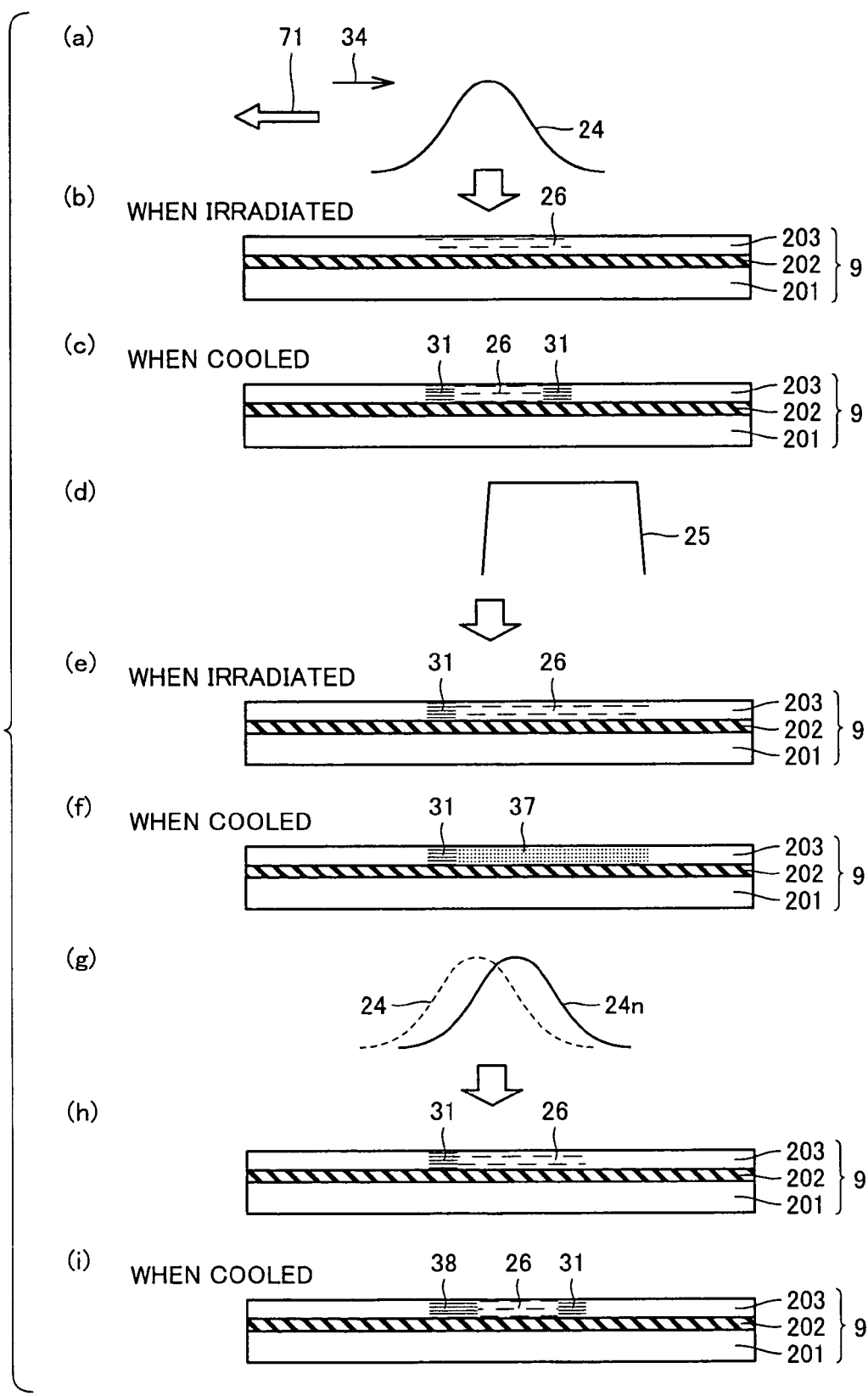
FIG. 20 is a view illustrating the step of polycrystallization included in a method for manufacturing a thin-film semiconductor in a fifth embodiment in accordance with the present invention.

Referring to FIG. 20, explanation will be given on an apparatus for manufacturing a thin-film semiconductor in a fifth embodiment in accordance with the present invention. While the first pulse laser beam and the second pulse laser beam are each focused into a line shape and applied toward object 9 almost at the same time in the apparatus for manufacturing a thin-film semiconductor in the first to the fourth embodiments, the main point of the present invention is to alter the property of the laterally growing crystal portion formed by the steep gradient portion of the profile of the first pulse laser beam on the rear side in the direction in which the object moves, to be amorphous. Thus, it is not necessary to apply the first and the second pulse laser beams at the same time, and identical effects can be obtained even by altering the property of the laterally growing crystal portion to be amorphous using the second pulse laser beam between when the laterally growing crystal is formed by the steep gradient portion on the rear side in the direction in which the object moves and when it is irradiated with the steep gradient portion on the front side in the direction in which the object moves.

The first pulse laser beam having profile 24 shown in FIG. 20(a), as a profile of energy density, is applied. Object 9 moves in the direction indicated by arrow 71, and as a result, the first pulse laser beam scans object 9 in the direction indicated by arrow 34. Thus, as shown in FIG. 20(b), melted portion 26 is produced within amorphous silicon film 203 on the surface of object 9. Next, cooling is started to form laterally growing crystals 31 at the gradient portions on the both sides of profile 24 shown in FIG. 20(c). Then, the second pulse laser beam having profile 25 as shown in FIG. 20(d) is applied. In this occasion, the second pulse laser beam is applied to a position such that profile 25 overlaps the gradient portion of profile 24 on the rear side in the direction in which object 9 moves, that is, on the side opposite to arrow 71. As a result, as shown in FIG. 20(e), melted portion 26 is formed in the region covered with profile 25. In this occasion, a laterally growing crystal 31 on the front side in the direction in which object 9 moves remains, whereas laterally growing crystal 31 on the rear side in the direction in which object 9 moves becomes melted portion 26 again. As object 9 in this state is cooled, the portion which was melted portion 26 becomes amorphous as shown in FIG. 20(f) to be an amorphous portion 37. Next, the first pulse laser beam having a profile 24n as shown in FIG. 20(g) is applied. Profile 24n is displaced to the right in the drawing as compared with profile 24 when the first pulse laser beam was applied previously. Accordingly, as shown in FIG. 20(h), laterally growing crystal 31 on the left side in the drawing remains, and amorphous portion 37 becomes melted portion 26 again. In this occasion, the gradient portion of profile 24n is at a position displaced to the right in the drawing as compared to the gradient portion formed in profile 24, and thus the crystal further grows from an end portion of laterally growing crystal 31 to the right side in the drawing. Therefore, an elongated, excellent quality crystal as a laterally growing crystal 38 shown in FIG. 20(*i*) is formed after cooling. Although laterally growing crystal 31 is also formed at the gradient portion of profile 24 on the right side in the drawing, this portion later becomes amorphous by being irradiated with the second pulse laser beam in the ultraviolet range having profile 25 (see FIG. 20(*d*)) again. Scanning on the surface of object 9 proceeds as a cycle from FIG. 20(*d*) to FIG. 20(*i*) is repeated according to such procedures.

Effects identical to those in the embodiments described above can also be obtained by applying the first pulse laser and the second pulse laser at respective timings, instead of at the same time, as in the present embodiment.

Particularly, when independent laser beam sources are used as in the third embodiment, it is convenient to apply the first pulse laser and the second pulse laser at respective timings as in the present embodiment, because synchronization on the order of several nanoseconds for simultaneous irradiation is not required. In the present embodiment, it is sufficient as long as synchronization can be implemented very roughly on the order of at most milliseconds, which is the oscillation cycle of the first pulse laser, and thus stability of the method and the apparatus for manufacturing a thin-film semiconductor is enhanced.

It is to be noted that the above embodiments disclosed herein are by way of example and not by way of limitation in every respect. The scope of the invention is defined not by the above description but by the appended claims, and includes meanings equivalent to the appended claims and all modifications falling within the scope thereof.

INDUSTRIAL APPLICABILITY

The present invention is applicable to the manufacturing of a thin-film semiconductor.

The invention claimed is:

1. A method of manufacturing a polycrystalline silicon film by crystallizing a silicon film, the method comprising:
   simultaneously irradiating a first irradiated region on the silicon film with pulsed visible laser light focused to have a linear shape, and a second irradiated region on the silicon film, partially overlapping the first irradiated region, with pulsed ultraviolet laser light;
   moving the silicon film relative to the visible and ultraviolet laser light in a movement direction perpendicular to a longitudinal direction of the linear shape of the pulsed visible laser light, wherein a part of the first irradiated region precedes the second irradiated region, along the movement direction; and
   repeating simultaneously irradiating the first and second irradiated regions and moving the silicon film relative to the visible and ultraviolet laser light so that regions subsequently irradiated overlap regions previously irradiated, along the movement direction.

2. The method of manufacturing a polycrystalline silicon film according to claim 1, wherein a part of the second irradiated region succeeds the first irradiated region, along the movement direction.

3. The method of manufacturing a polycrystalline silicon film according to claim 1 including producing laser light with an Nd:YAG laser, producing a second harmonic of the laser light as the pulsed visible laser light, and producing a higher harmonic of the laser light, the higher harmonic having a wavelength shorter than the wavelength of the second harmonic, as the pulsed ultraviolet laser light.

4. A method of manufacturing a semiconductor device comprising the method of manufacturing a polycrystalline silicon film according to claim 1.

5. A method of manufacturing a thin-film transistor comprising:
   manufacturing a polycrystalline silicon film according to claim 1 on an electrically insulating support, including forming a base film on the support and forming the silicon film so that the base film is interposed between the support and the silicon film;
   patterning the polycrystalline film into an island on the support;
   forming a gate insulating film covering the island of the polycrystalline silicon film;
   forming a gate electrode on the gate insulating film;
   forming an interlayer insulating on the gate insulating film, covering the gate electrode; and
   forming a source electrode and a drain electrode for connection to the island of the polycrystalline silicon film.

6. A method of manufacturing a polycrystalline silicon film by crystallizing a silicon film, the method comprising:
   in a first step, irradiating a first irradiated region on the silicon film with pulsed visible laser light focused to have a linear shape;
   in a second step, irradiating a second irradiated region on the silicon film, partially overlapping the first irradiated region, with pulsed ultraviolet laser light;
   in a third step, moving the silicon film relative to the visible and ultraviolet laser light in a movement direction perpendicular to a longitudinal direction of the linear shape of the pulsed visible laser light, wherein a part of the first irradiated region precedes the second irradiated region, along the movement direction; and
   in a fourth step, irradiating parts of the first and second regions with the pulsed visible laser light focused to have a linear shape.

7. The method of manufacturing a polycrystalline silicon film according to claim 6, wherein a part of the second irradiated region succeeds the first irradiated region, along the movement direction.

8. The method of manufacturing a polycrystalline silicon film according to claim 6 including producing laser light with an Nd:YAG laser, producing a second harmonic of the laser light as the pulsed visible laser light, and producing a higher harmonic of the laser light, the higher harmonic having a wavelength shorter than the wavelength of the second harmonic, as the pulsed ultraviolet laser light.

9. The method of manufacturing a polycrystalline silicon film according to claim 6, including, after the fourth step, repeating the second, third, and fourth steps, without the first step, cyclically.

10. An apparatus for manufacturing a polycrystalline silicon film by crystallizing a silicon film, the apparatus comprising:
    a source of pulsed visible laser light;
    a focusing unit for focusing the pulsed visible laser light into a linear shape irradiating a first irradiated region on the silicon film, the first irradiated region being displaced with time relative to the pulsed visible laser light so that a first irradiated region irradiated later in time partially overlaps, along a movement direction perpendicular to a longitudinal direction of the linear shape, a first irradiated region irradiated earlier in time; and
    a source of pulsed ultraviolet laser light, the pulsed ultraviolet laser light irradiating a second irradiated region on the silicon film, the second irradiated region partially overlapping the first irradiated region, while or before the pulsed visible laser light irradiates the first irradiated region.

11. The apparatus for manufacturing a polycrystalline silicon film according to claim 10 comprising a moving unit for moving the silicon film relative to the visible laser light and the ultraviolet laser light along the movement direction so that a part of the first irradiated region precedes the second irradiated region along the movement direction.

12. The apparatus for manufacturing a polycrystalline silicon film according to claim 10, wherein said source of pulsed visible laser light and said source of pulsed ultraviolet laser light comprises a single Nd:YAG laser, and a harmonic generating unit generating as the pulsed visible laser light a second harmonic of laser light produced by the Nd:YAG laser and producing as the pulsed ultraviolet laser light a higher harmonic of the laser light produced by the Nd:YAG laser.

13. The apparatus for manufacturing a polycrystalllne silicon film according to claim 10, comprising:
   a laser light transmitting unit transmitting the pulsed visible laser light and the pulsed ultraviolet laser light on a common optical axis; and
   prisms arranged symmetrically with respect to the optical axis to differentiate angles of the pulsed visible laser light and of the pulsed ultraviolet laser light in the laser light transmitting unit.

* * * * *